United States Patent
Bernier et al.

[11] Patent Number: 6,069,023
[45] Date of Patent: May 30, 2000

[54] ATTACHING HEAT SINKS DIRECTLY TO FLIP CHIPS AND CERAMIC CHIP CARRIERS

[75] Inventors: William Emmett Bernier, Endwell; Michael Anthony Gaynes; Irving Memis, both of Vestal; Hussain Shaukatuallah, Endwell, all of N.Y.

[73] Assignee: International Business Machines Corporation, Armonk, N.Y.

[21] Appl. No.: 09/094,401

[22] Filed: Jun. 10, 1998

Related U.S. Application Data

[62] Division of application No. 08/672,875, Jun. 28, 1996, Pat. No. 5,847,929.

[51] Int. Cl.$^7$ .................................................. H01L 21/44
[52] U.S. Cl. .......................... 438/107; 438/118; 438/119; 438/122
[58] Field of Search ................................... 438/107, 108, 438/118, 119, 122; 361/718, 719

[56] References Cited

U.S. PATENT DOCUMENTS

| | | | |
|---|---|---|---|
| 4,000,509 | 12/1976 | Jarvela | 357/81 |
| 4,092,697 | 5/1978 | Spaight | 361/386 |
| 4,604,644 | 8/1986 | Beckham et al. | 357/80 |
| 4,701,482 | 10/1987 | Itoh et al. | 523/435 |
| 4,742,024 | 5/1988 | Sugimoto et al. | 437/211 |
| 4,914,551 | 4/1990 | Anschel et al. | 361/389 |
| 5,050,039 | 9/1991 | Edfors . | |
| 5,089,440 | 2/1992 | Christie et al. | 437/209 |
| 5,097,318 | 3/1992 | Tanaka et al. | 357/74 |
| 5,147,084 | 9/1992 | Behun et al. | 228/56.3 |
| 5,159,535 | 10/1992 | Desai | 361/398 |
| 5,168,430 | 12/1992 | Nitsch et al. | 361/398 |
| 5,210,941 | 5/1993 | Turek et al. | 29/852 |
| 5,271,150 | 12/1993 | Inasaka | 29/852 |
| 5,278,724 | 1/1994 | Angulas et al. | 361/707 |
| 5,367,196 | 11/1994 | Mahulikar et al. | 257/787 |
| 5,377,077 | 12/1994 | Burns | 361/704 |
| 5,432,913 | 7/1995 | Smits et al. . | |
| 5,471,366 | 11/1995 | Ozawa | 361/704 |
| 5,773,362 | 6/1998 | Tonti et al. | 438/665 |
| 5,847,929 | 12/1998 | Bernier et al. | 361/719 |

FOREIGN PATENT DOCUMENTS

| | | |
|---|---|---|
| 0 282 977 | 9/1988 | European Pat. Off. . |
| 0 421 599 | 4/1991 | European Pat. Off. . |
| 0 566 872 | 10/1993 | European Pat. Off. . |
| 0 566 872 A2 | 10/1993 | European Pat. Off. . |
| 0 632 685 | 1/1995 | European Pat. Off. . |
| 04257248 | 9/1992 | Japan . |

OTHER PUBLICATIONS

Anonymous, RD 302032 (abstract only), Jun. 10, 1989.

(List continued on next page.)

*Primary Examiner*—Caridad Everhart
*Attorney, Agent, or Firm*—Pollock, Vande Sande & Amernick

[57] ABSTRACT

An aluminum or copper heat sink is attached to a ceramic cap or exposed semiconductor chip using an adhesive of silicon or flexible-epoxy adhesive. The aluminum may be coated by anodizing or Chromate conversion or the copper may be coated with nickel or gold Chromium. Such structures are especially useful for flip chip attachment to flexible or rigid organic circuit boards or modules such as CQFP, CBGA, CCGA, CPGA, TBGA, PBGA, DCAM, MCM-L, and other chip carrier packages in which the back side of chips are connected directly to heat sinks. These adhesive materials withstand wet or dry thermal cycle tests of −65 to 150° C. for 1,000 cycles and 85° C. and 85% relative humidity for 1000 hours while maintaining a tensile strenth of at least 500 psi. The adhesive contains materials having high thermal conductivity and a low coefficient of thermal expansion (CTE) in order to provide increased thermal performance and a CTE between that of the silicon metal die and the metal of the heat sink.

46 Claims, 13 Drawing Sheets

OTHER PUBLICATIONS

Schrottke et al., Removal of Heat from Direct Chip Attach Circuitry, IBM Technical Disclosure Bulletin, vol. 32, No. 4A, Sep. 1989.

Technical Data Sheet, Ablebond® P1–8971, Low Stress Die Attach Adhesive, 1993.

Information About High Technology Silicone Materials, Dow Corning Corporation, 1988.

Semiconductor Packaging Materials, GE Silicons, Selector Guide (date unknown).

GE Silicones Fast Fax System . . . GE Silicones, (Nov. 1994).

Bosworth et al., Exceptional Performance from the Development, Qualification and Implementation of a Silicone Adhesive for Bonding Heatsinks to Semiconductor Packages, May 4, 1994 Proceedings, 44th Electronic Components & Technology Conference, IEEE Catalog No. 94CH3241–7, New York, pp. 260–269.

Information About High Technology Silicone Materials, Dow Corning Corporation, 1988.

Shaukatullah Bibliography on Heat Sinks for Thermal Enhancement of Electronic Packages, Jul. 7, 1996, pp. 1–49.

Shaukatullah et al., Thermal Characterization of Tape Ball Grid Array Packages, Jul. 8, 1996.

Vanwert et al., One–Part Thermal–Cure Silicone Adhesives, Dow Corning Coporation, pp. 797–804 (date unknown).

Wilson et al., Thermally Conductive Adhesives for High Thermally Stressed Assembly, Dow Corning Corporation, pp. 788–796 (date unknown).

Bernier et al., Optimization of Thermal Adhesive Bond Strength for Extended Use of TBGA at Elevated Temperatures, Mar., 1995.

ATTACHING HEAT SINKS DIRECTLY TO FLIP CHIPS AND CERAMIC CHIP CARRIERS

RELATED APPLICATIONS

The present application is a divisional application of U.S. patent application Ser. No. 08/672,875, filed Jun. 28, 1996 now U.S. Pat. No. 5,847,929.

This document is protected by copyright except to the extent required by law to obtain and continue all available patent protection.

TECHNICAL FIELD OF INVENTION

These inventions are related to the production of electronic components, the assembly of components to circuitized substrates to form circuit boards, and the assembly of the circuit boards with a power supply to provide information handling systems. More particularly, these inventions are most closely related to the art of attaching heat spreaders or heat sinks to electronic components and the resulting structures.

The following background is for convenience of those skilled in the art and for incorporating the listed citations by reference. The following is not an assertion that a search adequate for examination has been made, or that no other pertinent art exists, or that any of the following citations are material, or that any of the following citations are analogous art, or prior art.

BACKGROUND OF THE FIELD

During the fabrication of interconnect structures many types of components are attached to circuit cards. The wiring layers on the card as well as the components generate resistance heat. Furthermore, active components generate heat during switching. The heat raises the temperature of the components above the ambient temperatures of the air surrounding the systems. Most electronic components have some maximum temperature above which they will quickly fail, but also, the life span of active components is generally related to the temperature raised to some power (typically 2). Thus it is advantageous to keep electronic components as cool as practical.

For most applications, most of the heat generated in the components is conducted by a thermal path through the component terminals into a circuitized card substrate (most commonly fiberglass filled epoxy) and through the wiring layers of the card. The card dissipates the heat by convection to the surrounding air, and by radiation to the enclosure containing the board, and through card connectors and supports to other boards or the enclosure. Also, typically, some of the generated heat is removed through the back side of the component by convection to the surrounding atmosphere and to a lesser extent, radiation to any cooler surfaces surrounding the card.

Recently, component densities on circuit boards have increased to the extent that a large portion of the space on the card is heat generating components, also line widths on circuit boards are narrowing so that more heat is generated in the signal lines of the circuitized cards. Thus, the thermal path through the leads is less useful in lowering component temperatures and the thermal path through the back sides of components is becoming more important.

In very high performance applications (e.g. large mainframes) a helium or water cooling system including a cold plate, is provided and the cold plate is thermally connected to the components by thermal grease. Such thermal greases are typically thick organic liquids (such as silicone oils) filled with particles of a highly thermoconductive material such as alumina, beryllium, copper, silver, or graphite. In main frame applications flip chips have been attached on the backs of ceramic PGAs (CPGAS) using controlled collapse chip connections C4s. The chips are directly thermoconnected to a cold plate of a liquid cooling system by a thermal grease.

In more typical high performance applications a heat sink (e.g. aluminum Al or copper Cu) is mechanically clipped or screw attached against a component to increase the dissipation of heat by convection directly into the surrounding air. Thermal grease is usually provided to fill voids between the heat sink and the component since even a very thin air gap becomes a significant resistance layer in the thermal path.

To increase thermal performance, individual power transistors have been supplied potted in T0–T3 cans by silicone or epoxy potting compound. Again such adhesives have been filled with thermoconductive materials to increase thermal conduction and reduce the temperature of the semiconductor devices. Such discrete power transistors have also been supplied in a small thin package with a hole for screwed connection to circuit boards with thermal grease provided between the transistor and board. Also, simple heat sinks of bent plate, have been provided to increase thermal performance.

Integrated circuit components are characterized by large numbers of input and output I/O connection terminals. Organic materials have been used extensively in production of such integrated electronic components. Most common components are manufactured by producing a lead frame on a polyimide tape, using an adhesive (e.g. epoxy or silicone adhesives) to connect the back side of a wire bond chip onto the lead frame tape and wire bonding to connect the front of the die to the leads of the frame. The adhesives manufactured for connecting chips to polyimide tape are usually filled with thermoconductive particles to increase heat conduction from the chip and thus minimize chip temperature.

Plastic components are usually manufactured by transfer molding to encapsulate the chip, bond wires, and part of the leads with epoxy to form a plastic substrate. Ceramic components are usually manufactured by providing a cavity under a ceramic substrate into which the chip, bond wires are placed and then the polyimide tape is adhesively bonded to the ceramic substrate with epoxy or silicone adhesives and the chip and cavity is filled with thermoconductive epoxy or silicone adhesive. A ceramic bottom substrate may be bonded over the bottom of the cavity to protect the bottom of the component.

Heat sinks have usually been connected to integrated packages by screwing or clipping. Non-silicone greases are commonly used between the heat sink and the modules to increase thermal performance. The heat sinks are usually connected to integrated components after circuit board assembly. Recently in order to reduce costs, manufacturers have started adhesively bonding heat sinks directly to organic or ceramic surfaces of electronic components after circuit board assembly using epoxy based materials. Since the coefficient of thermal expansion CTE of epoxy is around 50–80 ppm/° C. and the CTE of Al is 23.4 ppm/° C. and copper is 17 ppm/° C. and the coatings used for heat sinks (bare copper, nickel coated copper, bare Al, anodized Al, chromium conversion on Al) are smooth and do not adhere well to epoxy, it is difficult to maintain bonding during thermal cycling. Typically in order to increase thermal conduction and to also reduce delamination problems, the epoxy used for heat sink attach is filled with thermoconductive metal or ceramic particles that modify the CTE of the adhesive to a level (e.g. 30–40 ppm/° C.) which is midway between that of the module material (epoxy) and that of the base metal of the heat sink.

In high temperature applications silicone adhesives have been suggested to connect anodized Al heat sinks to ceramic surfaces of modules because silicone-based adhesives are very heat resistant. Silicone-based adhesives have Tg's below 25° C. and Young's Module below 2,000 psi, and are thus, very compliant. However silicon has a very high coefficient of thermal expansion of around 200 ppm, and it is difficult to provide reliable bonds between silicone and common heat sink surfaces. Mechanically, the bond strengths between silicone adhesive and these metal surfaces are about one third to one half the strength of epoxy. Silicone is a weak material with a tensile strength of only about 500 psi verses about 2,000 psi for epoxy. Also, constituents of silicone adhesives have a tendency to migrate out contaminating surfaces with a micro thin coating which prevents subsequent attachment of other organic materials to the circuit boards such as photoresists, solder resists, and encapsulants. Usually heat sinks are attached after other process for constructing circuit boards is complete thus minimizing contamination problems during construction. Contamination is especially a problem for reworked components because heating the silicone during rework greatly increases the contamination and prevents any subsequent encapsulation or other non-silicone processes on the circuit board that may be required for rework.

Those skilled in the art are directed to the following citations for additional information. U.S. Pat. No. 4,000,509 to Jarvela describes using thermal grease to thermally connect a flip chip to a heat sink. U.S. Pat. No. 5,271,150 to Inasaka, describes manufacture of ceramic substrates. U.S. Pat. No. 4,604,644 to Beckham; U.S. Pat. Nos. 4,999,699 and 5,089,440 to Christie; and U.S. Pat. No. 4,701,482 to Itoh describe using epoxy to encapsulate C4 joints. U.S. Pat. No. 5,159,535 to Desai describes attaching the back of flip chips to a substrate. European Patent Application 93104433.3 to Bennett discloses a semiconductor die attached to a lead frame. U.S. Pat. No. 4,914,551 to Anschel discloses attaching a semiconductor chip to a heat spreader of silicon carbide (SiC), aluminum nitride (AlN), or Cu-Invar-Cu using epoxy. *Removal of Heat From Direct Chip Attach Circuitry* by G. Schrottke and D. J. Willson in *IBM Technical Disclosure Bulletin* Volume 32 Number 4A September, 1989, discloses using adhesive to bond silicon chips to a Cu-Invar-Cu heat spreader. U.S. Pat. No. 5,168,430 to Nitsch in FIG. 2 shows a hybrid circuit structure 3 cemented to a heat spreader 4. *Technical Data Sheet for Ablebond P1-8971* by Ablestik of October 1993 recommends attaching a large die to a silver coated copper lead frame using flexible epoxy. *Product Data Sheet for Prima-Bond EG 7655* by A. I. Technology, Inc. recommends bonding Alumina to Aluminum and Silicon to Copper. *New Product Description for X3-6325* by Dow Corning 1994 suggests a silicone adhesive "used for bonding, sealing and adhering substrates lids and heat sinks." *Information About High Technology Silicon Materials* by Dow Corning 1988 suggest using SYLGARD® Q3-6605 silicone adhesive for attaching "hybrid integrated circuit substrates, components and devices to heat sinks." *Semiconductor Packaging Materials Selector Guide* by General Electric suggests using RTV6424 a silicone adhesive, "for die-attach applications" MS-523 Silicone Technical Bulletin by Thermoset Plastics, Inc. suggests using the silicone adhesive "to bond heat sinks to plastic, ceramic, and metalized packages." *TC3280G Silicone Rubber Adhesive* by General Electric 1994 describes the properties of the subject silicone adhesive. *Exceptional Performance from the Development, Qualification and Implementations of a Silicone Adhesive for Bonding Heat sinks to Semiconductor Packages* by Bosworth, Hsu, and Polcari in *Proceedings of the 44th Electronic Components and Technology Conference*, 1994 describes using silicone adhesive to connect heat sinks to ceramic packages. U.S. Pat. No. 5,180,625 to Wang, suggests connecting an aluminum plate to a ceramic circuit board using flexible thermoconductive epoxy. *One-Part Thermal-Cure Silicone Adhesive* by Vanwert and Wilson in Proceedings of the Technical Program NEPCON West 96 in Feb. 27–29, 1996 at Anageim Calif., suggests using the silicone adhesive "for bare chip packaging." *Thermoconductive Adhesives for High Thermally Stressed Assembly* by Wilson, Norris, Scott and Costello suggests using I-4173 silicone adhesives for "bonding substrates, components and devices to heat sinks." U.S. Pat. No. 5,210,941 to Turek suggests attaching an aluminum heat sink to an organic circuit board using silicone adhesive. Japanese published application 64-148901 to Kanwa suggests a pagoda type heat sink. U.S. Pat. No. 4,092,697 to Spaight; and U.S. Pat. No. 4,742,024 to Sugimoto; U.S. Pat. No. 5,097,318 to Tanaka; U.S. Pat. No. 5,367,196 to Mahulikar; U.S. Pat. No. 5,168,430 to Nitsch; suggests thermally connecting a chip to a heat sink. U.S. Pat. No. 5,159,535 to Desai; U.S. Pat. No. 5,278,724 to Angulas; U.S. Pat. No. 5,147,084 to Behum suggest various flip chip carrying modules. *Optimization of Thermal Adhesive Bond Strength for Extended use of TBGA at Elevated Temperatures* by Bernier and Memis at NEPCON West Anaheim Calif., March 1995.

All the above citations are hereby incorporated in whole by reference to provide an enabling disclosure and to support the claims to which the applicant is entitled by law.

SUMMARY OF THE INVENTION

In these inventions an aluminum or copper based heat spreader is bonded directly to the back side of a semiconductor flip-chip or ceramic chip carrier surface.

The applicants have discovered that a thin layer of silicone adhesive can reliably bond a heat sink surface (e.g. aluminum, anodized aluminum, chromium coated aluminum, copper, nickel coated copper, or chromium conversion coated copper) directly to the back side of a silicon flip chip surface (glass or polyimide passivated) during wet or dry thermal cycling from −65° C. to 150° C. for 1000 cycles, and during 85° C. and 85% relative humidity for 1000 hours, and during 150° C. for 1000 hours, and maintain full strength of about 500 psi. Also, that contamination of surrounding surfaces can be reduced to acceptable levels by using a silicone adhesive in which low molecular weight cyclic compounds have been stripped out (e.g. by a heat vaporization process) and by attaching the heat sink to a component and baking the component at higher than eutectic reflow temperatures before attaching the component to the circuit board.

The applicants have also discovered, that a thin layer of a highly flexible-epoxy that has a glass transition temperature below room temperature can be used to bond the heat spreader directly to the back of a flip-chip or a ceramic surface and the bond will remain strong even after thermal cycle testing of 0 to 100° C. for 1500 cycles, −25 to 125° C. for 400 cycles, and −40 to 140° C. for 300 cycles; or after continuous exposure to 130 degrees C for 1000 hours, and still retain a strength of at least 500 psi.

In one embodiment of the invention, silicone or flexible-epoxy adhesive attached an aluminum or copper heat sink to the back side of a flip chip. In another embodiment flexible-epoxy connects an aluminum or copper heat spreader to a ceramic substrate.

Figure 1:
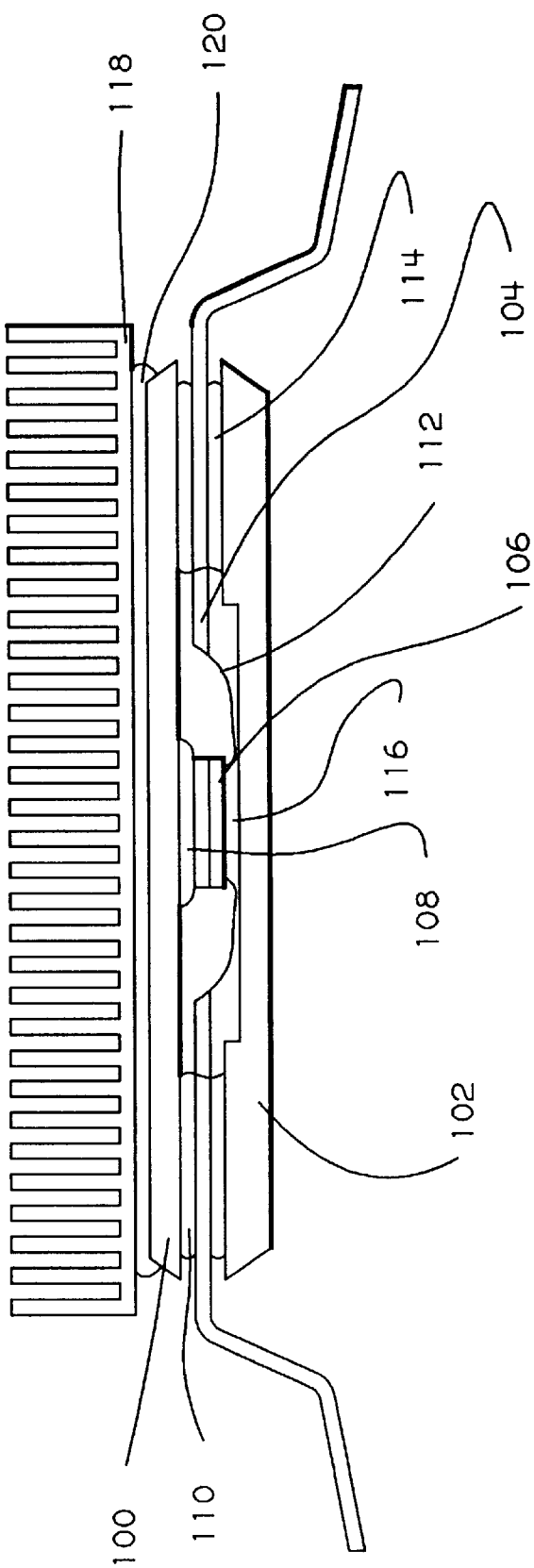
FIG. 1 schematically shows an aluminum or copper heat spreader bonded by flexible-epoxy to a CQFP to illustrate an embodiment of the invention.

The following detailed description of the inventions of Applicants enables those skilled in the art to make and use these inventions, and describes the best mode for carrying out the inventions.

DETAILED DESCRIPTION

Typical silicones include significant amounts of siloxane compounds (e.g. cyclic compounds) which vaporize during reflow heating and contaminate surrounding surfaces. Contamination of surrounding surfaces can be reduced by using a silicone adhesive in which low molecular weight silicone compounds (cyclic compounds) have been stripped out (e.g. by a heat vaporization process) so that contamination does not significantly affect subsequent reworking. Also, attaching heat sinks to components and baking at high temperatures (200–220° C.) before connection to the circuit board reduces contamination during subsequent reworking at the same or lower temperatures. Preferably the amount of silicone compounds which vaporize during reflow baking is less than 10% and more preferably less than 1% of the amount that vaporizes when typical silicone adhesives are cured and then baked sufficient to reflow eutectic Pb/Sn solder (200° C.) for component removal and then for component replacement. Preferably, the amount of vaporizable materials in the cured silicone used in the invention is less then 10% and more preferably less than 1% of the levels of such materials in typical unbaked silicone adhesives. Preferably, none of the constituents of the cured silicone significantly vaporize to produce small voids in the adhesive, up to a temperature of 200° C.

A suitable silicone adhesive is TC3280G which is available from General Electric Company, 260 Hudson River Rd., Waterford, N.Y. 12188.

Typical epoxies have a Tg of about 140–150 degrees C, but flexible-epoxies used in these inventions have a Tg below about 25° C., preferably below 10° C. and more preferably below 0° C. Also, typical epoxies have a Young's modulus of around 1,000,000 psi, but flexible-epoxies used in these inventions have a Young's modulus below about 100,000 psi, preferably below 50,000 psi, and even more preferably below 20,000 psi. A two part flexible-epoxy named Prima-Bond EG 7655, is available from AI Technologies Inc. 9 Princess Rd., Lawrencevill, N.J. 08648, and has a Tg of about −25° C. and a Young's modulus less than about 20,000 psi. A one part flexible-epoxy named ABLE-BOND® P1-8971 is distributed by Ablestick Laboratories, 20021 Susana Road, Rancho Dominguez, Calif. 90221. and has a Tg of about 5° C. and a Young's modules of less than about 50,000 psi.

The silicone adhesive is more preferred for higher temperature applications such as attaching directly to flip chips, where temperatures could exceed 130° C. and the flexible-epoxy is more preferred for less critical applications such as attaching heat sinks to ceramic surfaces. One common performance specification for electronic components is storage at 150° C. for 1000 hours. The flexible-epoxies of this invention can not undergo that test and still reliably provide 500 psi of tensile strength without delamination, but the silicone adhesive meets these requirements.

In FIG. 1, the CQFP module is produced from two preformed, fired halves 100, 102 of ceramic (preferably AlN). Semiconductor chip 106 (preferably silicon) is bonded to top half 100 of the flat pack using for example a typical die attach epoxy 108, and the chip is wire bonded 112 to the lead frame. The bond wires are gold or more commonly aluminum wires extending between aluminum or gold plated pads. Then top half 100 is bonded to bottom half 102 using for example a typical epoxy 110, 114. Cavity 116 is typically empty but may contain a dielectric, thermoconductive potting material (e.g. silicone grease). Then an Aluminum heat spreader 118 with a clean Al metal surface is attached to the top of the ceramic module using a thin layer of flexible-epoxy 120.

The surface of the aluminum is preferably treated to increase adhesion with the flexible-epoxy. For example the surface can be roughened by vapor blasting, grit blasting, etching or a similar roughening finishing can be used to increase adhesion of flexible-epoxy to aluminum.

The CTE of AlN is about 4.6 ppm/° C., and the CTE of the Al of the heat spreader is about 23.4 ppm/° C., which results in a CTE difference of 18.9 ppm/° C. The ceramic top is a relatively smooth surface and any delamination or cracking of the epoxy between the package and heat spreader causes a critical reduction in heat transfer from the chip. A common industry test is to subject components with bonded heat sinks to thermal cycling of 0 to 100° C. for 1500 cycles, −25 to 125° C. for 400 cycles, and −40 to 140° C. for 300 cycles, or continuous exposure to 130 degrees C for 1000 hours. The applicants have discovered that flexible-epoxies (e.g. ABLEBOND® P1-8971 from Ablestik and Prima-Bond EG 7655 from A.I. Technology, Inc., of Trenton, N.J.) meet the thermal cycling requirements of this test.

Alternatively, cap 102 may be replaced by an encapsulant (glob top of epoxy) to protect the wire bond chip. The epoxy may just cover the chip and wire bonds or it may extend to the circuit board on which the module is mounted. Also, an organic material such as fiberglass-epoxy or a laminate of copper and polyimide foils may be substituted for the ceramic of the top half 100.

Figure 2:
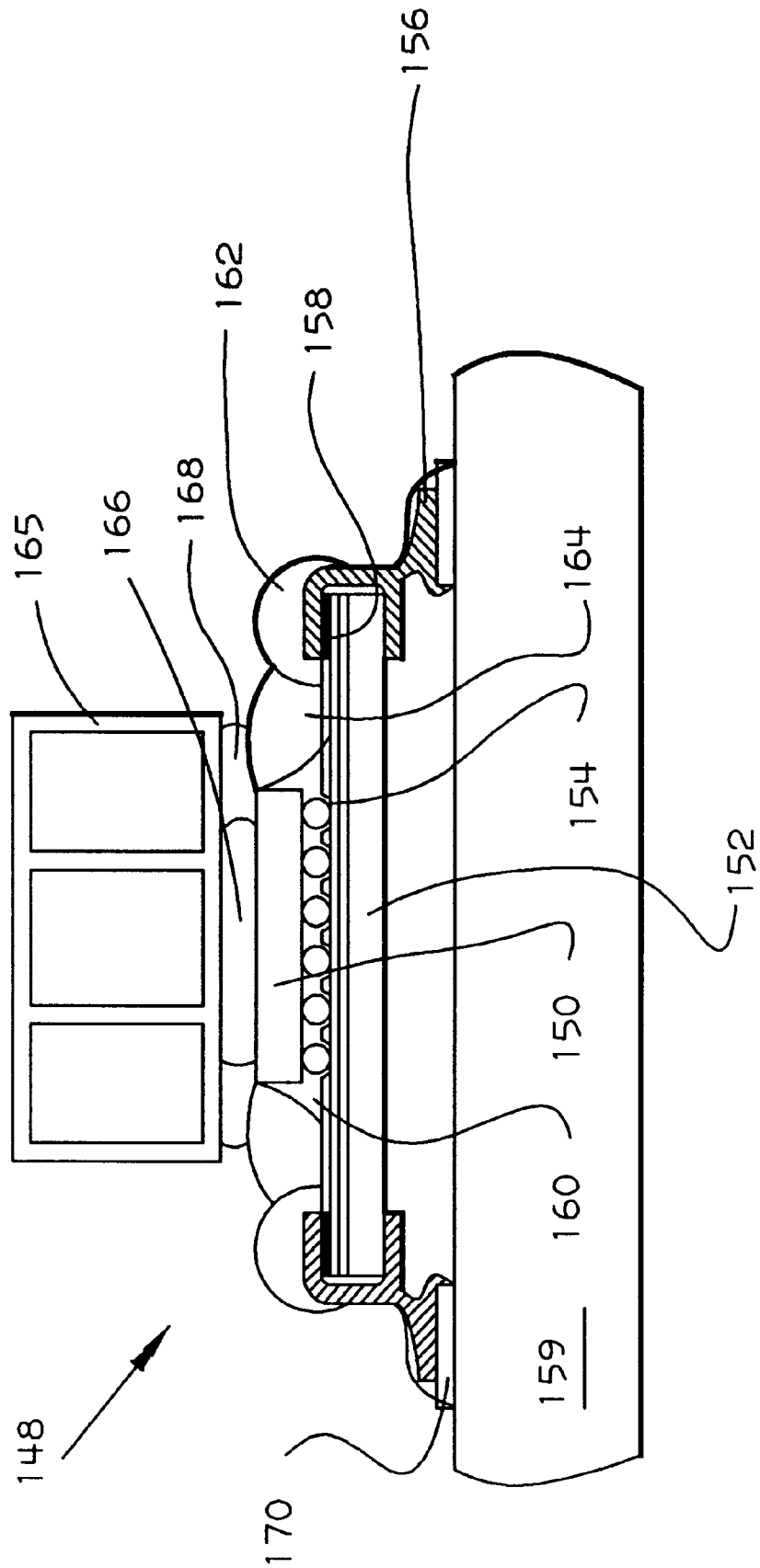
FIG. 2 schematically shows an aluminum or copper heat spreader bonded by flexible-epoxy or silicone adhesive to a semiconductor flip-chip on a capless CQFP to illustrate another embodiment of the invention.

FIG. 2 shows another CQFP 148 which does not have a ceramic cover. The front side (bottom) of a semiconductor flip-chip die 150 is attached to a single layer rectangular ceramic chip carrier 152 by a perimeter row or an area array of joints 154 that extend between conductive contacts on the chip to conductive contacts on the carrier.

The joints may be C4 joints or eutectic solder or joints of electrically conductive adhesive (ECA) such as thermoplastic adhesive filled with high melting temperature electroconductive particles (e.g. silver or copper or silver coated particles) or transient liquid phase (TLP) system particles. Typically the chip is passivated with a layer of polyimide or glass with windows exposing small aluminum pads of the wiring layer. Then the windows are covered with larger surface pads comprising layers of chromium, copper, and aluminum. For C4, the pads are covered with hemispheres of high temperature solder (Pb and 3–15% Sn and more preferably 3–10% Sn) by dry deposition or electroplating or screening solder paste and reflow or by liquid solder injection. The chip with C4 bumps may be directly connected to copper pads on a ceramic carrier substrate by the C4 process. Alternatively, the C4 bumps may be connected to copper pads on an organic coated carrier substrate using eutectic solder deposited on the C4 bumps or on the carrier pads. Alternately pads on the chip or on the organic coated substrate may be bumped with eutectic solder (e.g. Pb and 35–85% Sn and more preferably about 70% Sn).

TLP system particles are particles of a noble metal base coated with a reactive metal or reactive metal base coated with noble metal. The metals in common solder systems can be used to form TLP systems. In TLP, the amount of the coating metal is restricted with respect to the base metal so that when the material is heated the coating alloys with part of the base to form a molten eutectic coating which connects particles together but as the base continues to dissolve into the coating even at constant temperature, the proportions of the metal alloy change until the coating resolidifies.

Alternatively, the chip bumps could be attached to the contacts on the carrier by eutectic solder bumps deposited by plating, solder inject, or transfer from a decal.

Leads such as gull wing leads 156 are clipped to a peripheral row of copper pads 158 along two or more preferably all four edges (for QFPs) of the component and soldered 158 for surface mount connection to substrate 159. Alternatively, the bottom end of the leads may bend under the module in a J or even pointed straight down in an I shape. The leads are connected to pads 170 of metal (such as copper) on substrate 159 by solder such as Pb/Sn 37/63% by weight. The substrate is a ceramic such as alumina or beryllia. Alternatively, the substrate may be a rigid organic substrate such as fiberglass filled epoxy, or metal coated substrate such as Covar or Invar or Cu-Invar-Cu coated with polyimide film or a flexible circuit board substrate such as laminated layers of copper and polyimide. The chip connection joints 154 are encapsulated with epoxy 160 and preferably the lead clip connections are encapsulated with epoxy 162. Preferably an epoxy coating 164 is applied so as to protect the top layer ceramic circuitry (a conformal coating which is the same level at the top of the chip). Heat spreader 165 (of anodized aluminum) is attached to the back side of chip 150 using adhesive 166 of flexible-epoxy or more preferably a silicone adhesive. Improved mechanical strength may be obtained for heat spreaders that have a footprint much larger than the chip, by also bonding the heat spreader to the conformal coating at 168 with a typical epoxy or preferably with a flexible-epoxy. Encapsulating the silicone adhesive with epoxy reduces contamination of the circuit board during subsequent rework.

The CTE of Si metal is about 2.6 ppm/° C. and the CTE of the Al of the heat spreader is about 23.4 ppm/° C. which results in a CTE difference of 20.8 ppm/° C. The back of the chip is very smooth resulting in a weak mechanical bond. Any delamination of the epoxy between the chip and heat spreader would cause a critical reduction in heat transfer from the chip, resulting in an extreme increase in chip temperature and failure.

Figure 3:
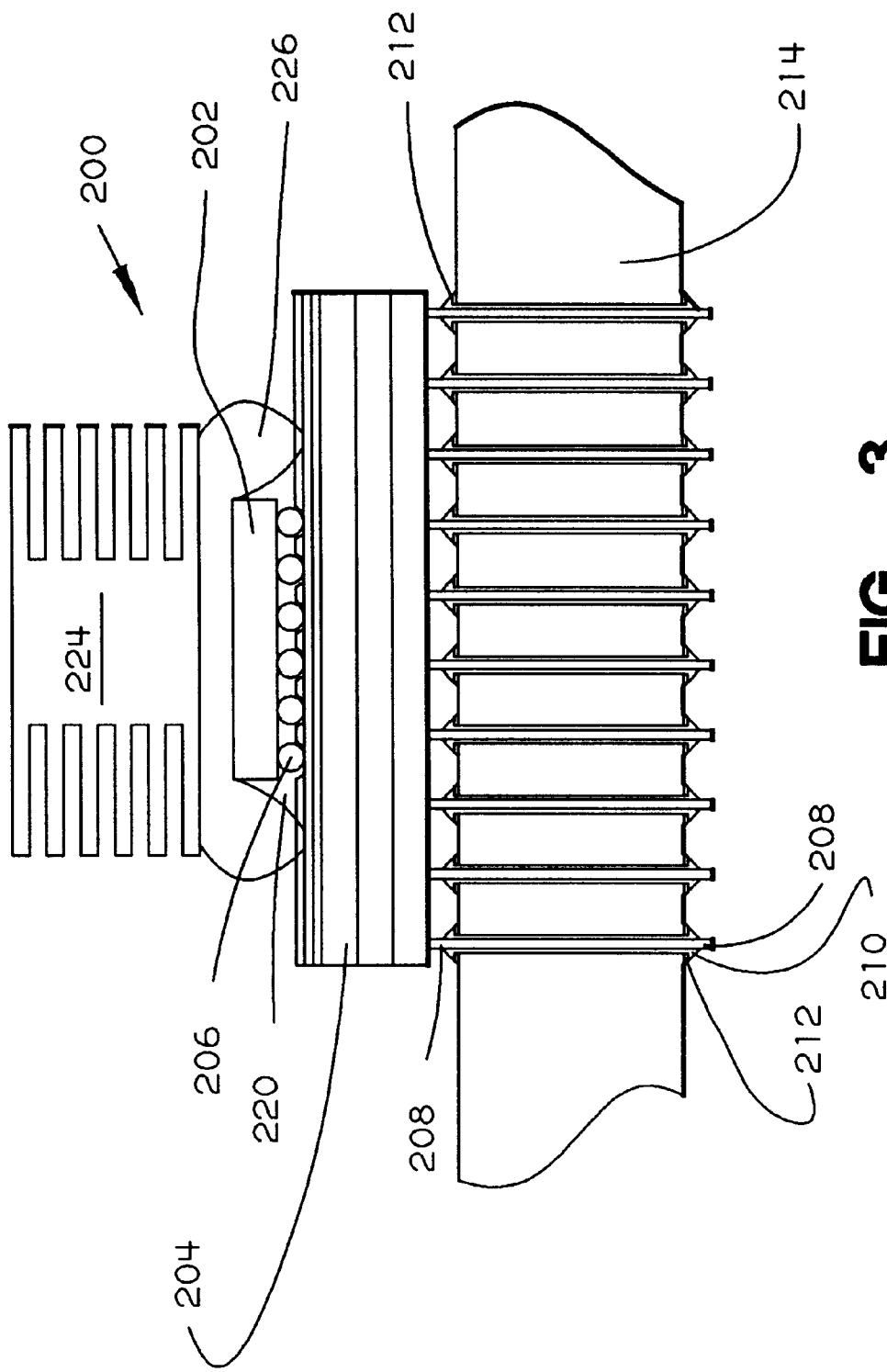
FIG. 3 schematically shows an aluminum or copper heat spreader bonded by silicone or flexible-epoxy adhesive to a semiconductor flip-chip on a CPGA to illustrate another embodiment of the invention.

FIG. 3 shows a CPGA (ceramic pin grid array module) 200. The front side (bottom) of a semiconductor flip-chip die 202 is attached to a rectangular ceramic chip carrier 204 (single or multi-layer as shown) by a perimeter row or area array of joints 206. Alternatively, substrate 204 may be organic or metal coated with organic. A matrix of pins 208 are wave soldered 210 to copper pads 212 on both end of PTHs (plated-through-holes) extending through substrate 214 (e.g. fiberglass epoxy or flexible laminate of copper-polyimide films). Joints 206 are encapsulated with epoxy 220 and heat spreader 224 is attached to the back side of chip 202 using adhesive 226 of flexible-epoxy or more preferably silicon.

Figure 4:
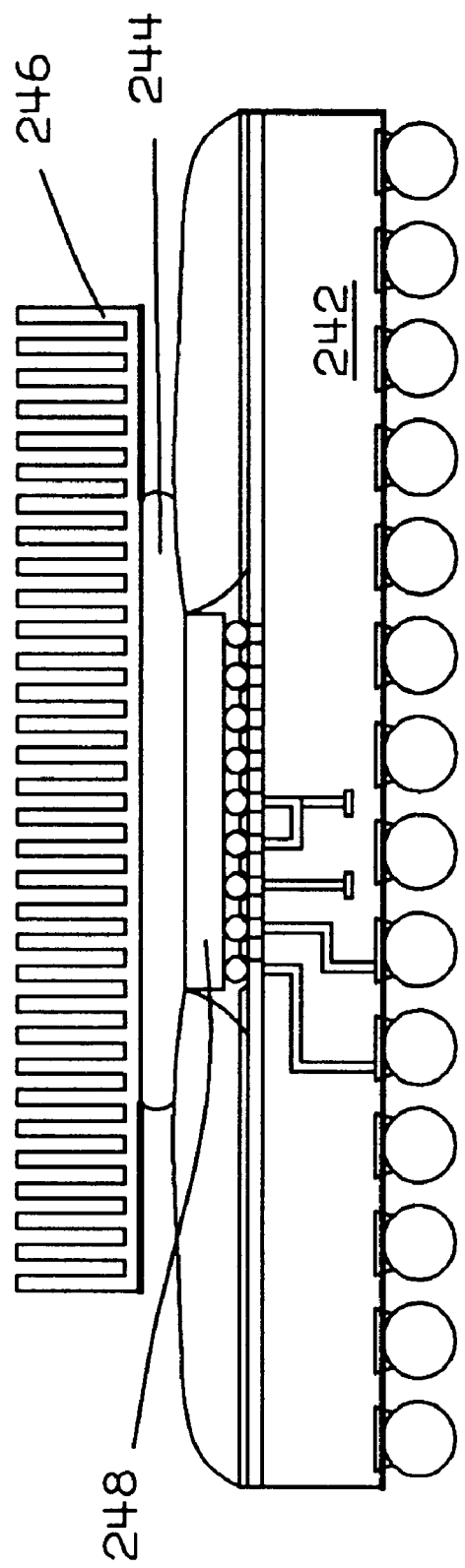
FIG. 4 schematically shows another embodiment of the invention similar to FIG. 3 and in which a copper or aluminum heat spreader is bonded to a semiconductor flip-chip by silicone or flexible-epoxy adhesive on a CBGA or PBGA.

FIG. 4 shows a BGA (ball grid array) module 240 which is similar to the CPGA of FIG. 3. Substrate 242 may be ceramic (CBGA) or plastic (PBGA) and may be single layer or multilayer as shown. Again, adhesive 244 of flexible-epoxy or more preferably silicon is used to attach heat sink 246 to flip-chip 248. In this case the heat sink is only slightly larger than the chip and the attach adhesive does not extend significantly between the heat sink and the conformal coating.

Figure 5:
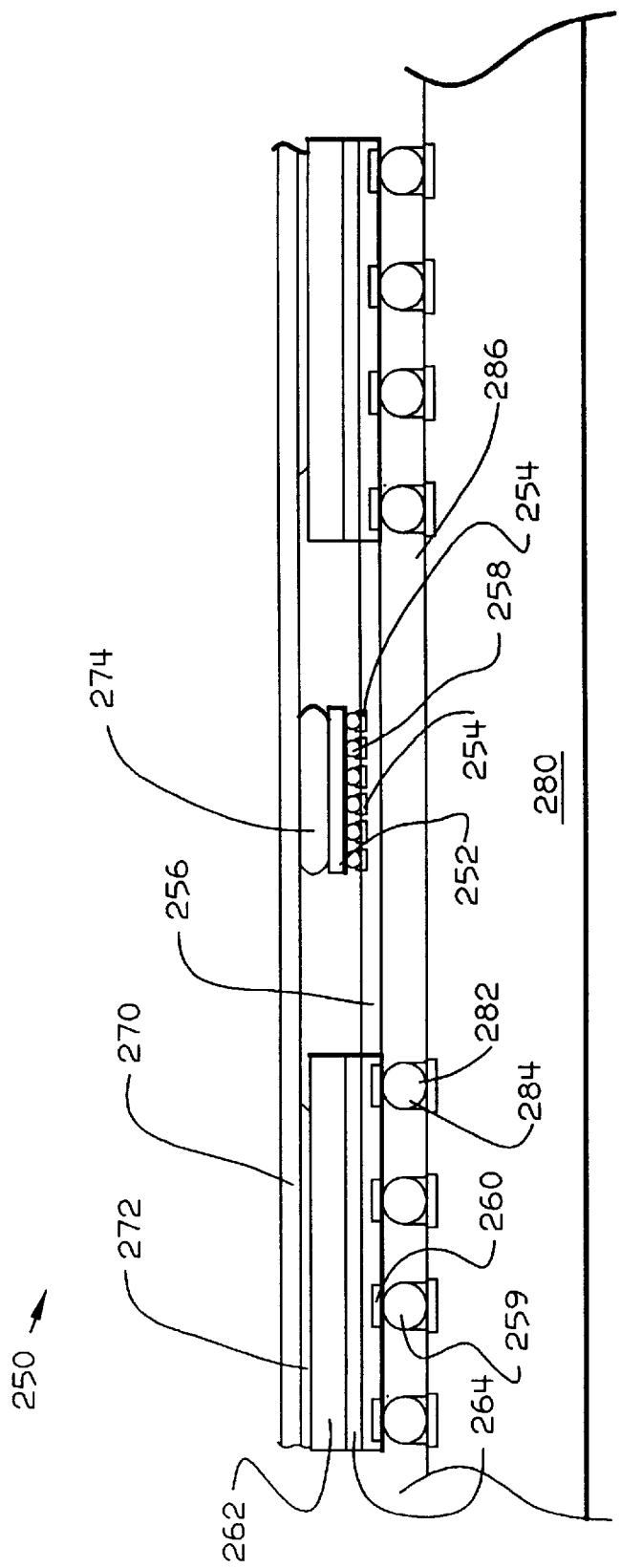
FIG. 5 schematically shows a copper or aluminum heat spreader bonded by silicone or flexible-epoxy to a semiconductor chip on a tape ball grid array package to illustrate another embodiment of the invention.

FIG. 5 shows a tape ball grid array (TBGA) module 250. The bottom (front side) of flip-chip 252 is attached to copper pads 254 of a flexible chip carrier substrate 256. The substrate is laminate of one or more patterned copper films and polyimide films. The copper may be dry deposited on the polyimide and then photolithograhically patterned or patterned foils of copper may be laminated to dry polyimide films. Joints 258 may be formed by a C4 process, by C4 bumps eutectic soldered to the pads, by thermal compression bonding C4 bumps to gold pads, by laser welding, or by SATT (solder attach tape technology). Rectangular metal frame 262 such as Al or preferably Cu plated by nickel (Ni), is attached to the flex substrate by adhesive 264 (preferably epoxy). Heat spreader 270 is a flat plate attached to frame 262 by adhesive 272 (preferably epoxy) and is attached to chip 252 by adhesive 274 of flexible-epoxy or more preferably silicon. The heat spreader may be Al which may be treated by anodization or coated with chromium conversion coating. More preferably, the heat spreader is Cu which may be treated by chromate conversion of more preferably coated with Ni. The nickel coating may be formed on clean copper by electrolessly plating or electroplating.

It is difficult to connect either flexible-epoxy or silicone adhesives to nickel. A process has been developed for treating the nickel for adhesion. The nickel coating is ultrasonically cleaned in isopropyl alcohol, rinsed with hot deionized water, exposed to hot hydrogen peroxide (30% solution at 40–100° C. preferably about 70–85° C.) for 1 to 10 minutes, to make the nickel coating wettable, rinsed with deionized water, and immediately exposed to a coupling agent (e.g. gamma-glycidoxypropyltrimethoxysilane (epoxy silane) or gamme-aminoprpyltriethoxysilane Z6040 made by Dow Corning (amino silane) in a 1–5% preferably 2% solution) for 1–2 minutes to improve adhesion. Then, the coupling agent is cured at 60–90° C. for 45–90 minutes and the heat sinks are again cleaned in isopropyl alcohol and rinsed in deionized water.

Module 250 is attached to substrate 280 (such as fiberglass epoxy or a flexible laminate described above) by depositing solder paste (preferably 37/63% Pb/Sn) on copper pads 282, placing the module on the substrate with the solder balls on the paste, and heating the structure until the paste becomes molten to form joints of solder 259. Alternatively, balls 258 and solder 284 may be replaced by an ECA encapsulated by a thermoplastic or thermoset 286, and which is attached to pads 282 by heat and pressure.

The CTE of Si is about 2.6 ppm/° C and the CTE of the Cu of the heat spreader is about 17 ppm/° C which results in a CTE difference of 14.4 ppm/° C. Again, the back of the chip is very smooth resulting in a weak mechanical bond and any delamination or cracking of the epoxy between the chip and heat spreader causes a critical reduction in heat transfer from the chip which greatly increases the chip temperature. When this structure is subjected to storage at 130° C. for 1000 hours then thermal cycling of 0 to 100° C. for 1,500 cycles, then −25 to 125° C. for 400 cycles, then −40 to 140° C. for 300 cycles required to prove the reliability of joints between these materials, common epoxies quickly fail (delaminate). The applicants have discovered that with proper treatment a joint between silicon and nickel plated copper of either silicone adhesives (e.g. TC3280G) or flexible-epoxy adhesives (e.g. ABLEBOND 8971 and EG 7655) reliably meet the thermal cycling requirements of this test.

Figure 6:
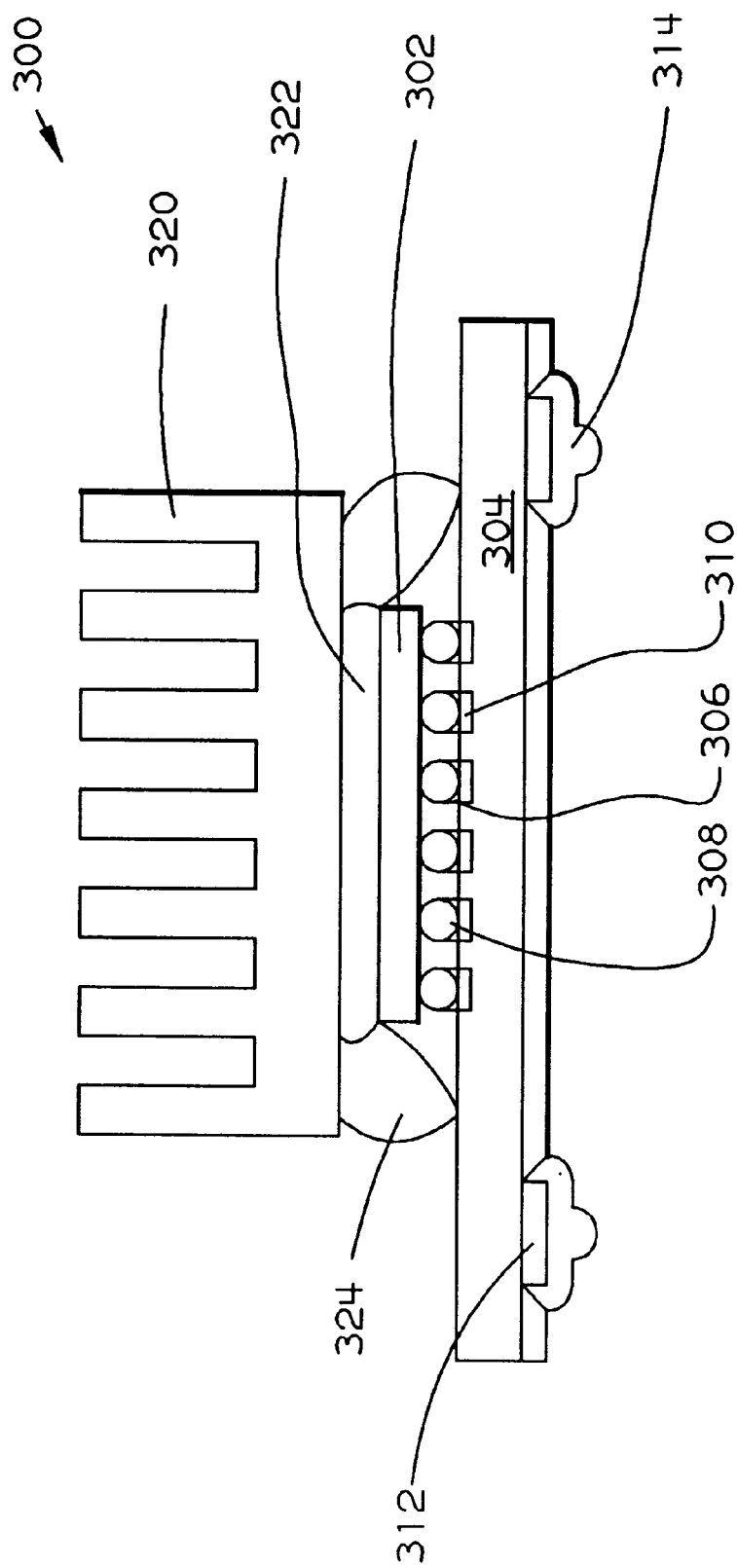
FIG. 6 schematically shows a copper or aluminum heat spreader bonded by silicone or flexible-epoxy adhesive to a semiconductor chip on a direct chip attachment module DCAM with an organic carrier substrate to illustrate another embodiment of the invention.

FIG. 6 shows a direct chip attach module DCAM 300. Flip-chip 302 is attached to a multi-layer fiberglass epoxy substrate 304. Eutectic solder 306 is deposited (by hot air soldering and leveling (HASL), solder-on-chip, solder inject, by transfer from a stainless steel decal) to connect between high temperature solder bumps 308 (e.g. 95/5% Pb/Sn alloy) on the bottom of the chip and copper pads 310 on the top surface of the substrate.

Copper pads 312 on the carrier substrate are positioned to connect to copper pads on an interconnect structure (organic circuit board as in FIGS. 2 and 5). Solder 314 may be provided on pads 312 for reflow soldered attachment. Alternatively, solder may be provided on the pads of the circuit board. Heat spreader 320 is attached to the back side of chip 302 using an adhesive 322 of flexible-epoxy or more preferably silicon. Improved mechanical strength can be obtained for heat spreaders which extend significantly past the limits of the chip by encapsulating between the heat spreader at 324 and substrate 304 using epoxy adhesives, silicone adhesives, or more preferably flexible-epoxy.

Figure 7:
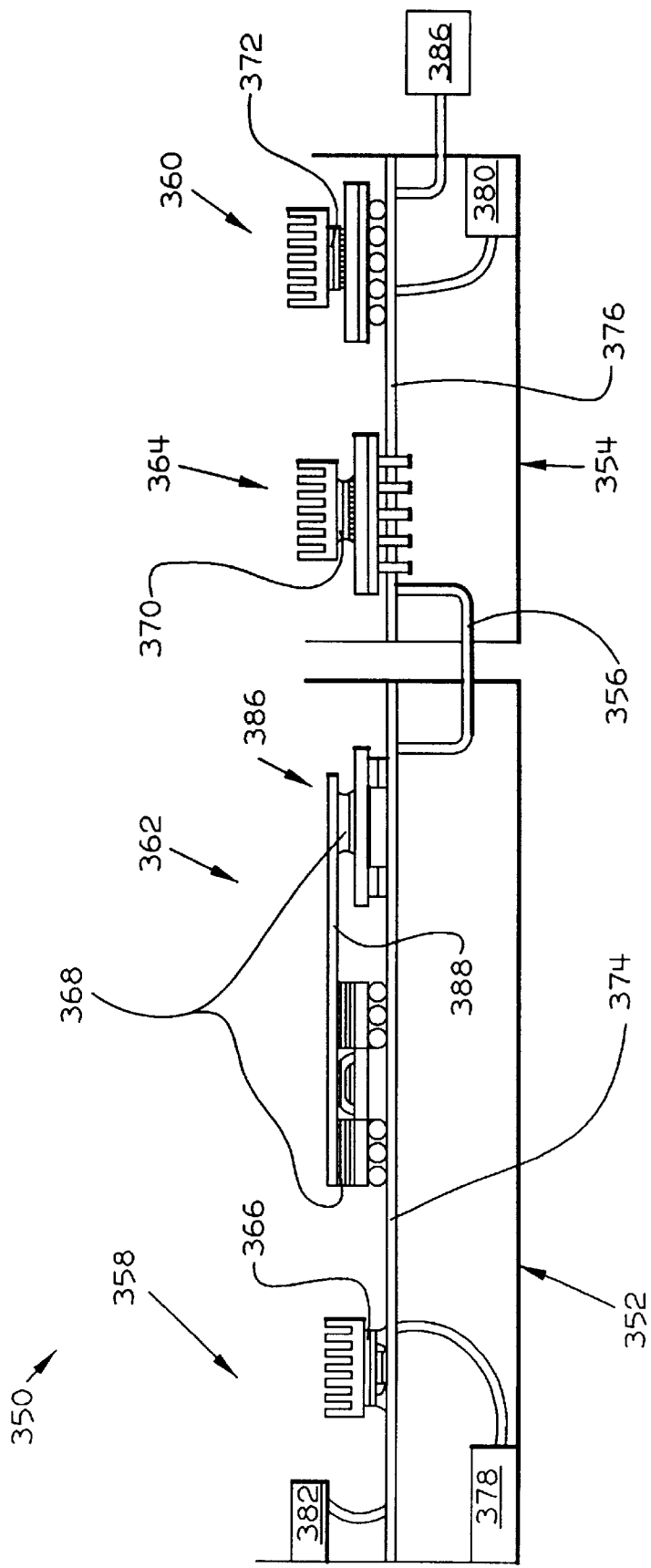
FIG. 7 schematically shows the information handling system of the invention which is enhanced by the thermal performance provided by bonding heat spreaders to ceramic and silicon surfaces of high power density components using silicone or flexible-epoxy adhesives.

FIG. 7 shows a computer network embodiment of the information handling system 350 of the invention. Computer systems 352 and 354 are networked together by optic or electrical signal cable 356. Systems 352 and 354 have CPU (central processor unit) modules 358, 360 and memory modules 362 and 364 respectively. The modules use silicone adhesive 366–372 to attach heat sinks to the modules to allow operation at higher power so that the performance of the entire information handling system is enhanced. The modules in each system are attached to one or more electrical interconnect structures 374, 376. The interconnect structures are electrically connected to power supplies 378, 380 such as batteries, transformers, or power cords, and may be connected to other computer devices 382 such as disk drives or other interconnect structures. One or more optic or electrical cables 394 or cable connectors is attached to the interconnect structures to provide for data input and output with computer peripherals 396 such as keyboards, mice, CRTs, MODEMs, sensors, motors, etc.

Modules 362 and 386 share the same aluminum or copper heat sink. The high compliance of silicone adhesives allow multiple components to share the heat sink regardless of the substantial difference between the CTE of epoxy circuit board 374 and aluminum or copper heat sink plate 388.

Figure 8:
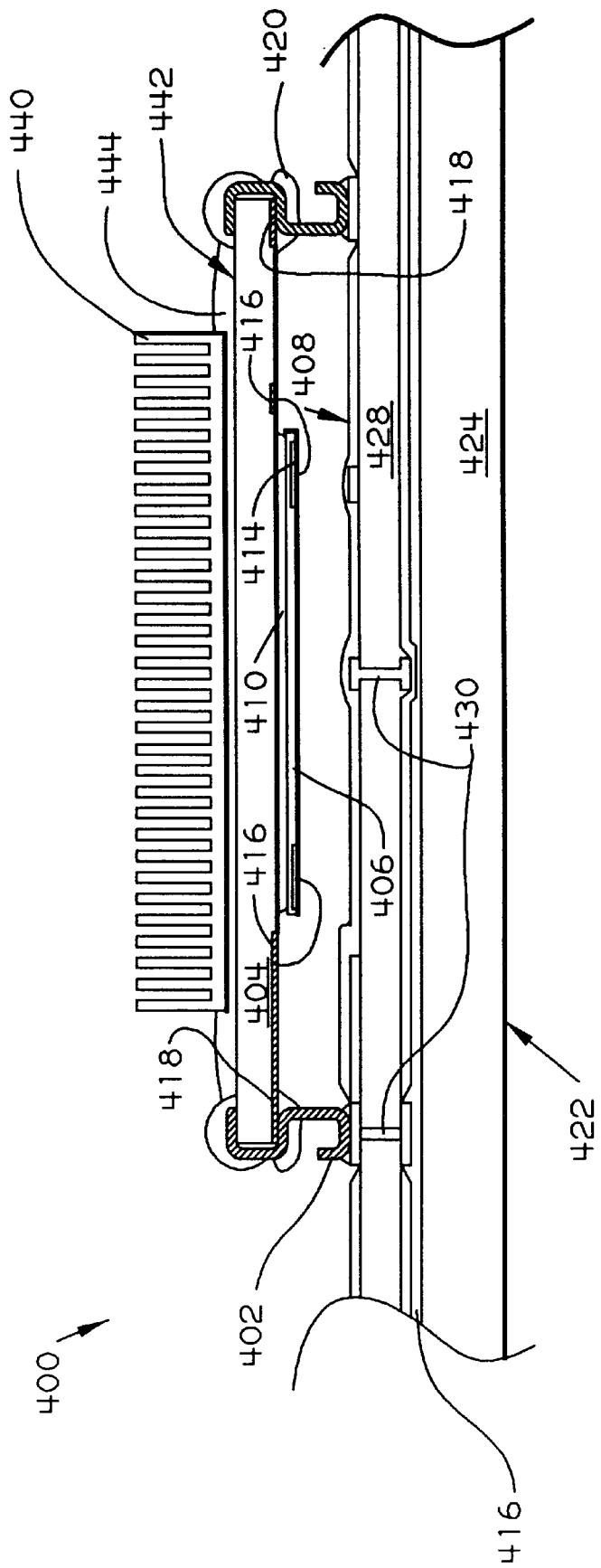
FIG. 8 schematically shows a copper or aluminum heat sink attached by flexible-epoxy to a ceramic TSOP with an underside mounted wire bond chip.

FIG. 8 illustrates a surface mount component 400 with J-leads 402 clipped to a single layer ceramic carrier substrate 404. A wire bond chip 406 is mechanically connected on underside 408 of the substrate by adhesive 410 of silicone or flexible-epoxy. The chip is electrically connected to the carrier substrate by wire bond wires 412 that extend between wire bond pads 414 on the chip and wire bond pads 416 which are part of a wiring layer on the underside of the carrier substrate. The J-leads are connected to pads 418 of the wiring layer by solder 420.

Component 400 is attached to a circuit board 422 which includes an aluminum ground and shielding plate 424 connected to a rigid organic circuit board 428 by electro-conductive adhesive 426 of silicone rubber or flexible-epoxy, filled with silver or copper particles. Conductive vias 430 connect between top and bottom wiring layers of the circuit board.

Heat sink 440 is connected to the ceramic upper surface 442 of the carrier substrate by adhesive 444 of silicone or flexible-epoxy.

Figure 10:
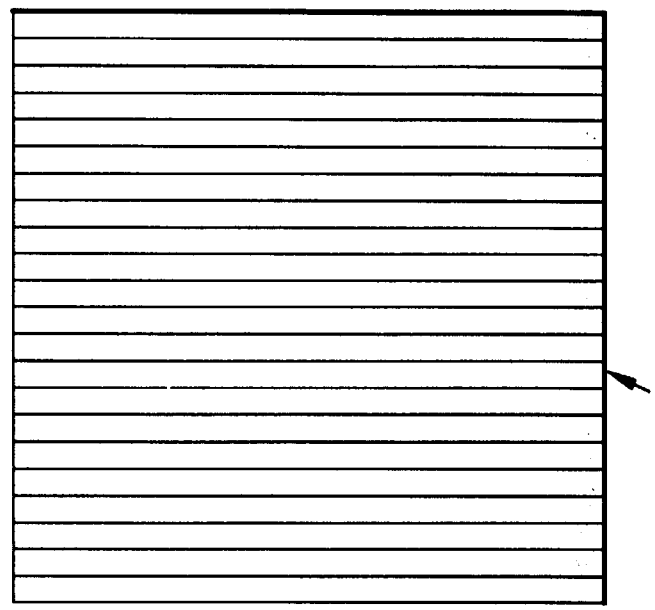
FIG. 10 is a top view of the heat sink of FIG. 8 with a plate fin embodiment of the invention.
Figure 9:
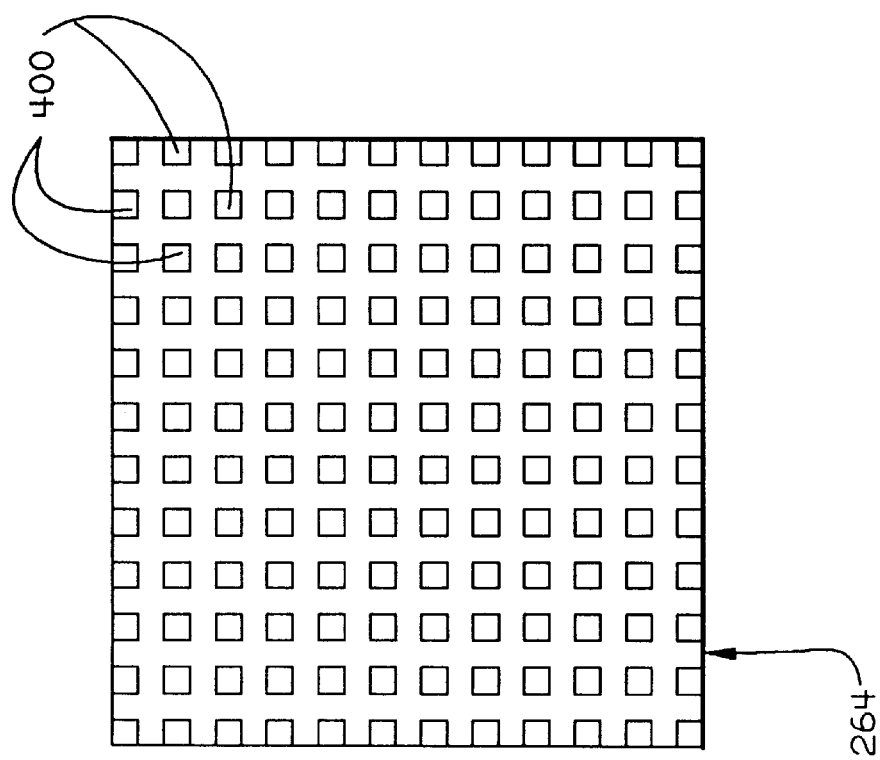
FIG. 9 is a top view of the heat sink of FIG. 4 in a pin fin embodiment of the invention.

FIG. 9 is a top view of heat sink 246 of FIG. 4 with a grid array of pins 450. The pins may be formed by extruding a fin. type heat sink and machining across the fins to produce the pins. Alternatively, the pins can be molded or cast. FIG. 10 is a top view of the heat sink 440 of FIG. 8 for a plate fin heat sink embodiment. Fins 452 may be machined from a thick plate of aluminum or copper or may be extruded or molded of aluminum or copper.

Figure 11:
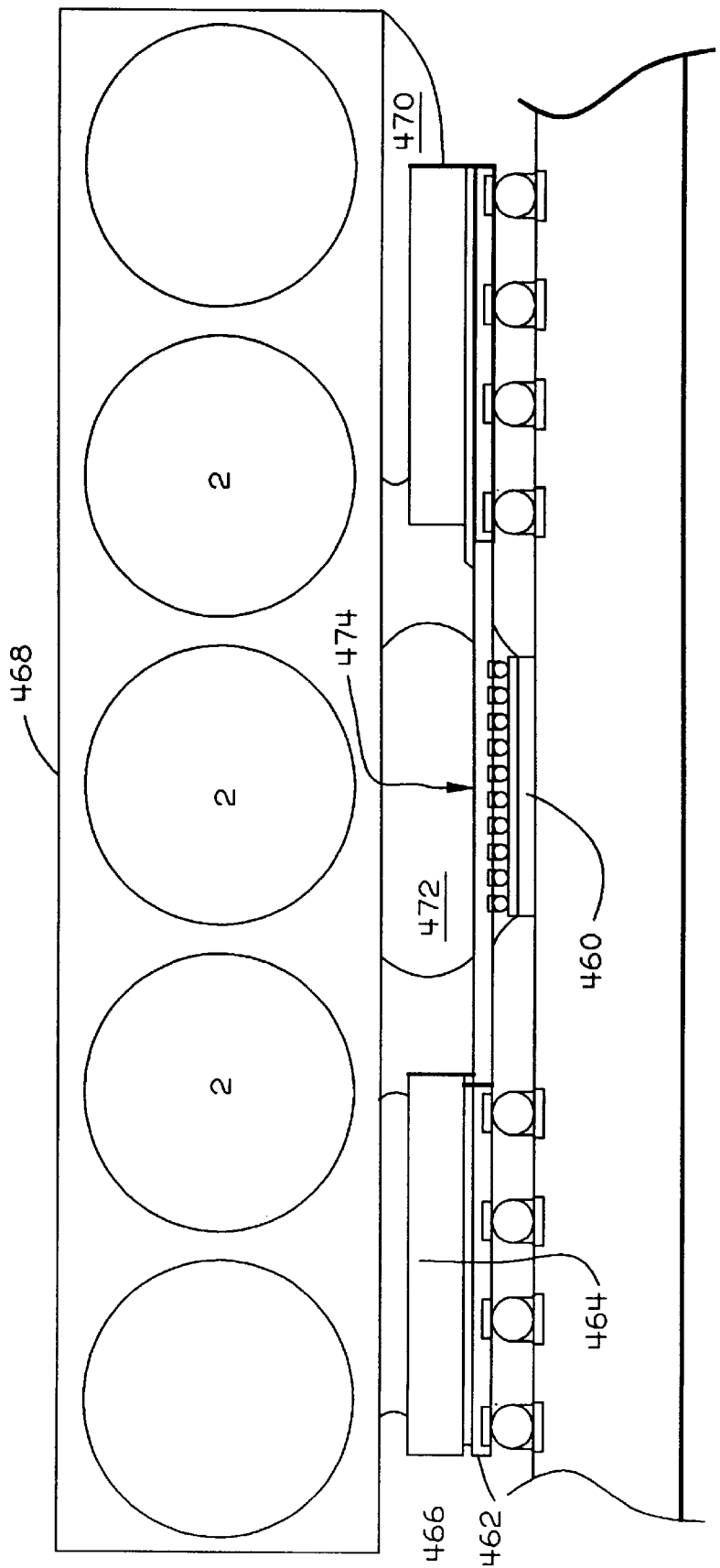
FIG. 11 schematically shows an underside mounted TBGA with a hole drilled heat sink of copper or aluminum attached by silicone or flexible-epoxy adhesive to TBGA.

FIG. 11 illustrates another embodiment of a TBGA module. In this specific embodiment flip chip 460 is connected to the bottom of flexible circuit board 462. Frame 464 of copper or aluminum is laminated to the flexible circuit board by adhesive 466 such as adhesive epoxy tape. A heat sink 468 is connected to the frame by adhesive 470. A potting material 472 such as silicone adhesive filled with thermo-conductive particles, extends between the heat sink and the flexible circuit board surface 474 opposite from the flip chip.

Figure 12:
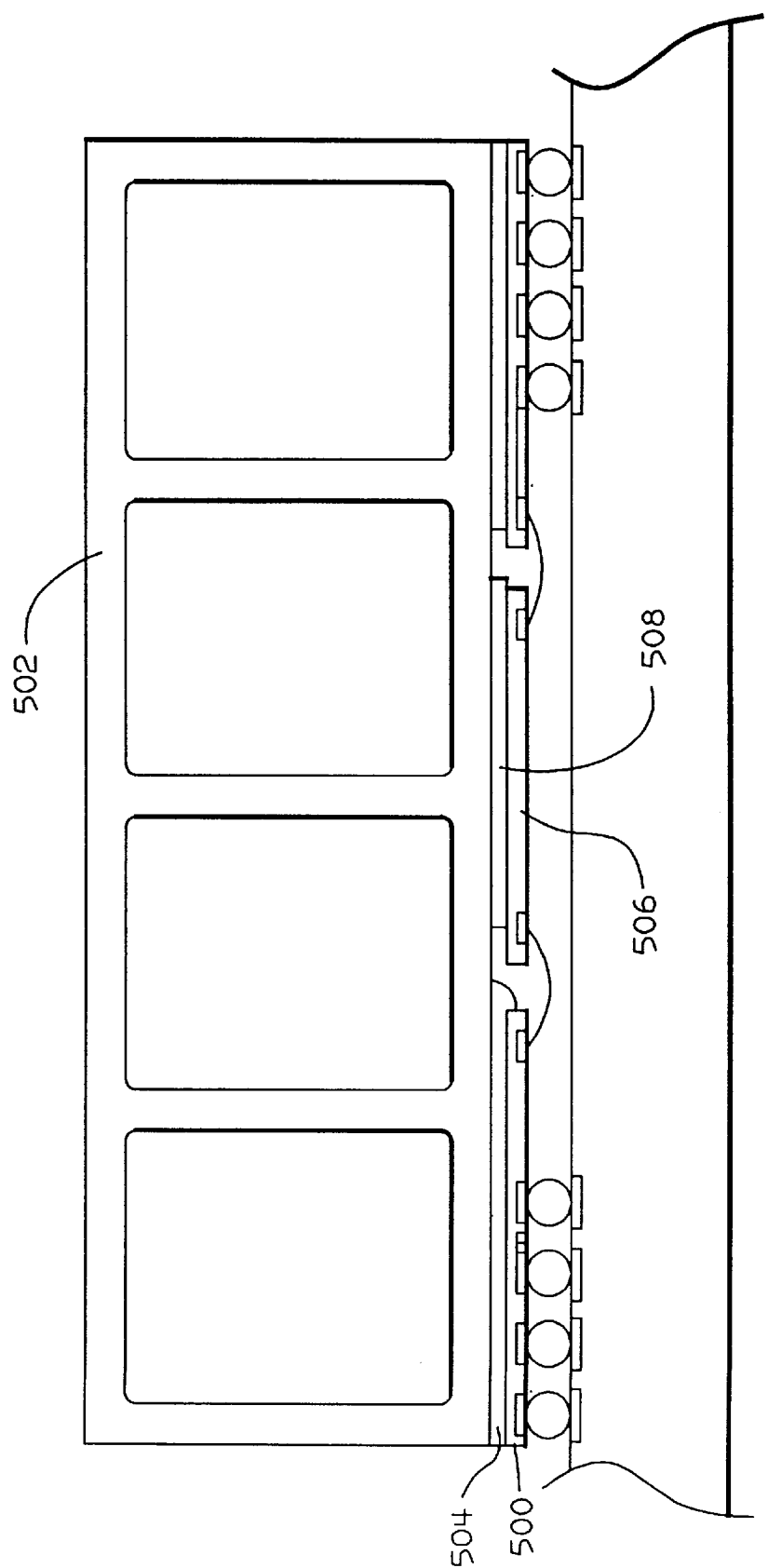
FIG. 12 schematically shows a brick type heat spreader attached to a TBGA with a bottom mounted wire bond chip, by silicone or flexible-epoxy adhesive.

Heat sink 468 comprises a thick plate with multiple parallel through holes along the central plane of the plate to allow air circulation through the plate. The holes 2 can extend all in the same direction or multiple holes can extend in each of two perpendicular directions. The holes can be formed by drilling or molding or by extrusion. FIG. 12 also illustrates a window 507 through the substrate.

FIG. 12 shows another TBGA module in which the flexible circuit board 500 is laminated directly to a brick type heat spreader 502 using an adhesive 504 such as dry adhesive film. The heat spreader may be produced by investment casting, molding, or extrusion. Wire bond chip 506 is bonded to the heat sink by adhesive 508 of flexible-epoxy or silicone rubber.

Figure 13:
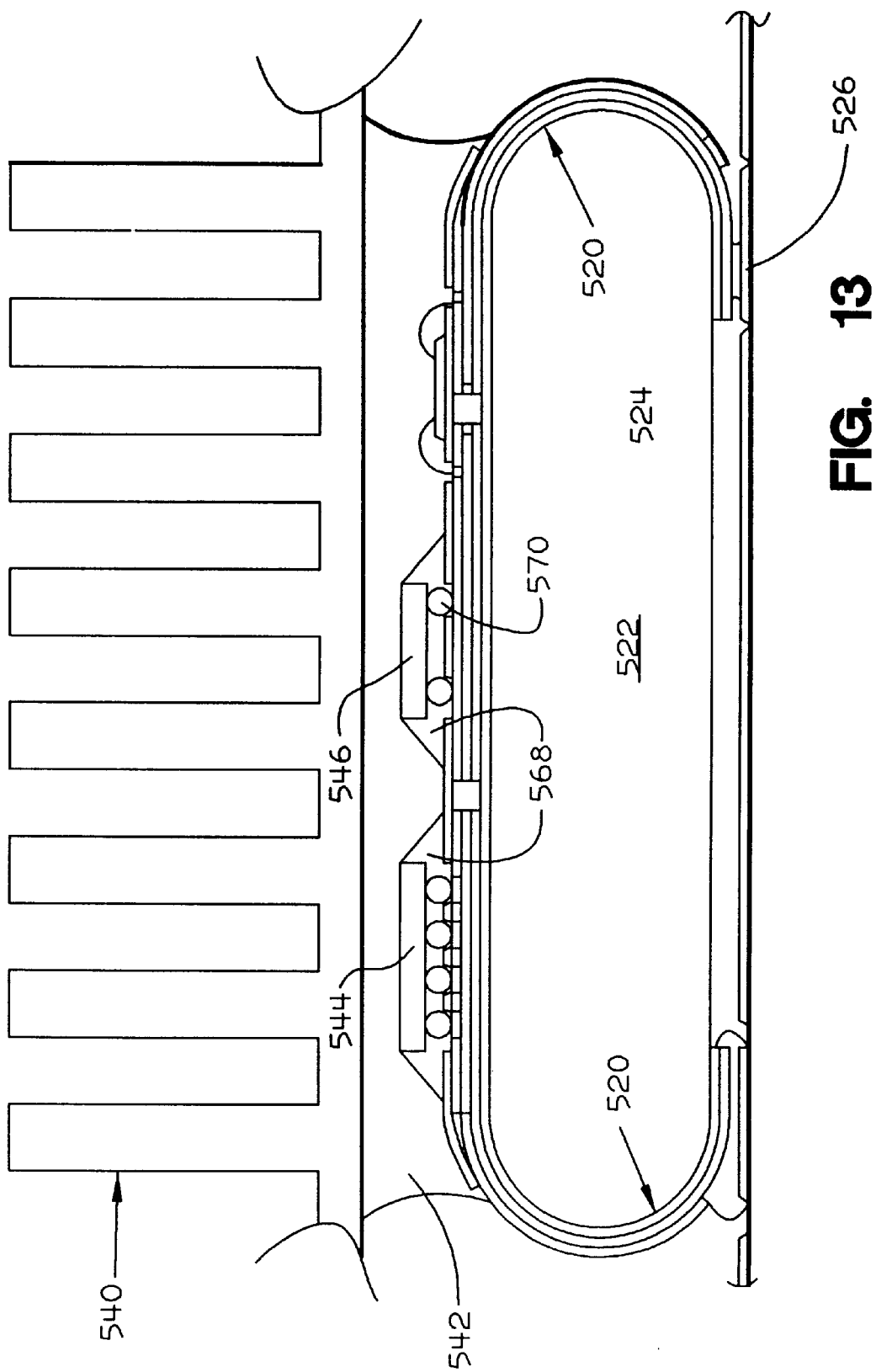
FIG. 13 schematically shows a copper or aluminum heat spreader attached to a flip chips and wire bond chips on a wrapped flexible substrate module using silicone or flexible-epoxy adhesive.

FIG. 13 depicts a multi-chip module in which a flexible circuit board 520 has been laminated around a base 522. The flexible circuit board includes a single wiring board covered on both sides by organic films containing windows for module connection pads. Exposed module pads 524 of the flexible circuit board are soldered to contact pads 526 on surface 528 of a rigid or flexible organic circuit board. Preferably, the module is bi-symmetric and the module pads connect to contact pads in the same pattern as a common quad flat pack. Heat spreader 540 is thermoconnected to the module by thermoconductive adhesive 542. The heat spreader extends to other modules (not shown) also attached to the circuit board surface 528. In this configuration silicone adhesive is preferred because the CTE of the heat sink will not match the CTE of the organic circuit board. Flip chips 544 and 546 are encapsulated with epoxy 568 in order to reduce thermal strains on the soldered joints 570.

Figure 14:
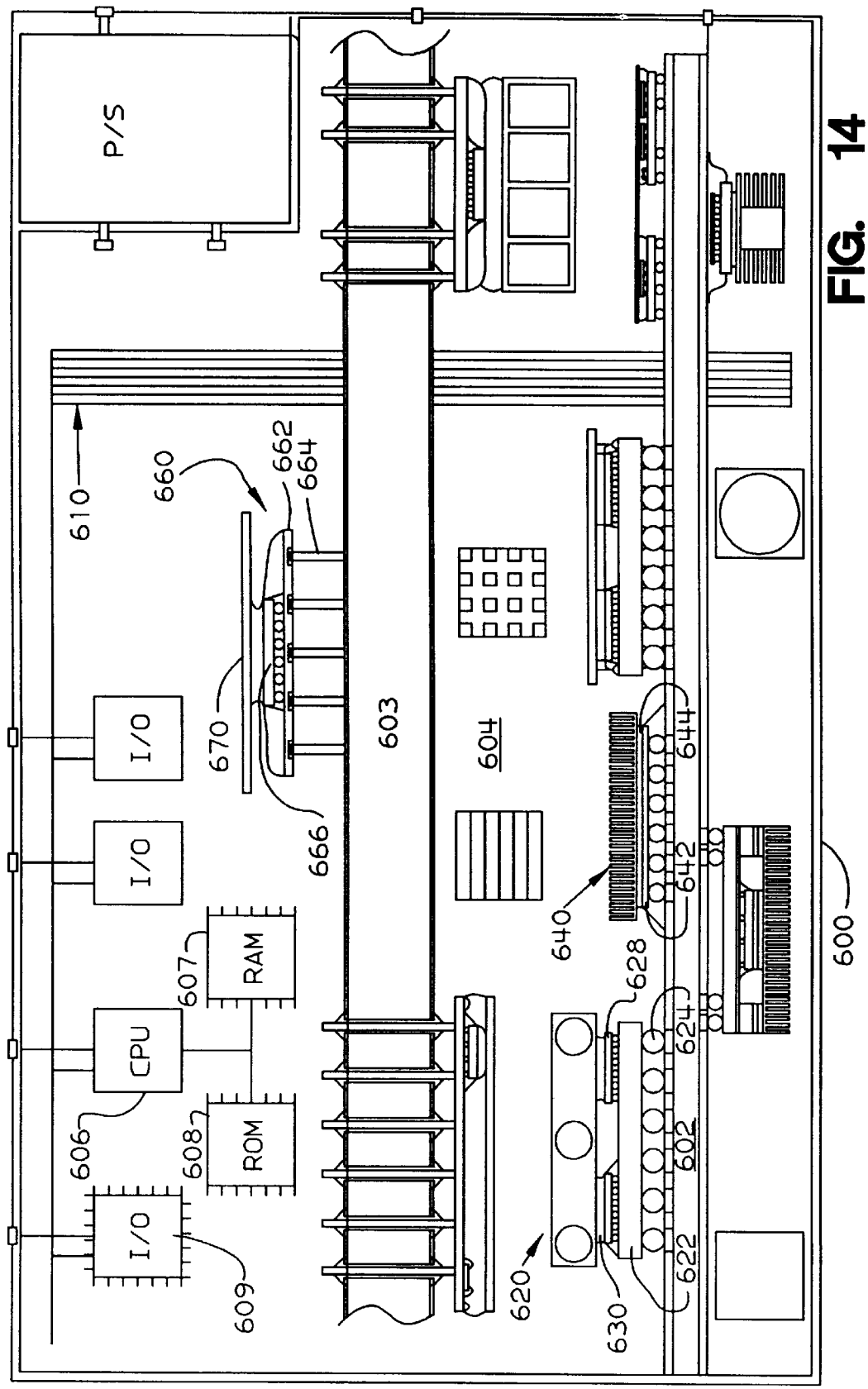
FIG. 14 schematically shows another embodiment of the information handling system of the invention using flexible-epoxy or silicone adhesive to connect heat sinks directly to flip chips and ceramic substrates to which chips are attached.

FIG. 14 portrays another embodiment of the information handling system of the invention in which heat spreaders are connected to ceramic and semiconductor surfaces using flexible epoxies and silicone rubber. In this embodiment enclosure 600 contains vertical circuit boards 602, 603 and horizontal mother board 604. The information handling system includes modules 606 defining a CPU, RAM modules 607, ROM modules 608, and I/O processor modules 609 on circuit board 604. Alternatively, one or more of such modules may be on the other circuit boards 602, 603. Bus 610 connects all the circuit boards of the information handling system together. A power supply 612 provides DC power to the mother board which supplies the power to the other board through bus 610. At this point, those skilled in the art will be able to identify the potential use of the inventions in the illustrated modules.

Module 620 includes a ceramic or preferably organic wiring substrate 622 connected to circuit board 602 using eutectic solder joints 624. Hole drilled heat sink 626 is connected to encapsulated flip chips 628 by silicone adhesive 630. Fin heat sink 640 is connected to encapsulated flip chip 642 by flexible-epoxy 644. Ceramic column grid array CCGA module 660 includes a ceramic substrate 662 with bottom pads to which columns 664 of high melting temperature solder are welded or soldered with eutectic solder. An encapsulated flip chip 666 is surrounded by a conformal coating and a layer of silicone rubber adhesive 668 connects between the flip chip and a heat sink 670.

While the invention has been described with reference to preferred embodiments of apparatus and methods it will be understood by those skilled in the art that changes may be made without departing from the spirit and scope of the invention which is only limited by the claims.

What is claimed is:

1. A method for producing chip carrier modules, comprising:
   providing wiring surfaces;
   electrically connecting first surfaces of semiconductor chips to the wiring surfaces with patterns of connections;
   encapsulating a space between the semiconductor chips and the wiring surfaces around each respective pattern of electrical connections, with an organic material;
   depositing silicone adhesive which is not fully cured, between second surfaces of the semiconductor chips and heat sinks;
   pressing the heat sinks and respective semiconductor chips together; and
   heating to cure the silicone adhesive, thereby directly attaching the semiconductor chips to the heat sinks.

2. The method of claim 1 in which:
   the electrically connecting includes reflowing solder to form solder joints between metal pads on the semiconductor chips and metal pads on the wiring surfaces;
   the method further comprises connecting additional semiconductor chips to the wiring surfaces and in which depositing the silicone adhesive includes depositing the adhesive between the heat sinks and multiple semiconductor chips;
   the providing of wiring surfaces includes producing metalized ceramic substrates;
   the depositing of the adhesive layer and the pressing together of the heat sinks and semiconductor chips produce layers of adhesive 2–4 mils thick;
   the organic material of the encapsulant is an epoxy;
   the method further comprises depositing a conformal coating of epoxy on the wiring surfaces around the semiconductor chips up to approximately the level of the semiconductor chips;
   the depositing of silicone adhesive includes depositing the silicone adhesive around the semiconductor chips between the heat sink and the conformal coating;
   the method further comprises filling the silicone adhesive with particles of alumina ceramic;
   the method further comprises filling the silicone adhesive with particles of aluminum metal;
   the method further comprises selecting a one part silicone adhesive;
   the method further comprises selecting a copper alloy for the heat sinks and plating a connection surface of the heat sinks with nickel;
   the method further comprises treating the nickel plated connection surface with hydrogen peroxide;
   the treating with hydrogen peroxide includes heating the hydrogen peroxide to 60 to 90° C.;
   the treating with hydrogen peroxide includes heating the hydrogen peroxide to approximately 75° C.;
   the method further comprises treating the nickel plated connection surface with amino-epoxide coupler during or after the treatment with hydrogen peroxide;
   the method further comprises treating the nickel plated connection surface with isopropyl alcohol prior to treating with hydrogen peroxide; and the method further comprises rinsing the nickel plated connection surface with deionized water after treatment with hydrogen peroxide.

3. The method of claim 1 in which:

the electrical connecting includes depositing an electrically conductive thermoplastic adhesive on the semiconductor chips or the wiring surfaces or on both;

the encapsulating around the pattern of connections includes depositing a dielectric thermoplastic adhesive around the deposits of conductive thermoplastic adhesive;

the providing of a wiring surface includes providing a rigid organic substrate;

the providing of a rigid substrate includes providing axially stiff fibers and filling epoxy with the fibers;

the providing of axially stiff fibers includes providing woven fiberglass fabric;

the depositing of silicone adhesive includes filling the space around the semiconductor chips between the heat sinks and the wiring surfaces with the silicone adhesive;

the method further comprises selecting a copper alloy for the heat sinks; and the method further comprises coating a connection surface of the copper heat sinks with chromium.

4. The method of claim 1 in which:

the providing of wiring surfaces includes providing one or more wiring layers of metal film separated and covered by two or more films of organic dielectric film to form a flexible circuit board with windows in the dielectric layer covering the wiring surface to expose metal pads connected to conductors of the wiring layers;

the method further comprises filling up the area around the semiconductor chips between the wiring surfaces and the heat sinks with epoxy adhesive and selecting a flexible-epoxy adhesive for the epoxy adhesive;

the method further comprises selecting an aluminum alloy for the heat sinks; and the method further comprises anodizing a connection surface of the aluminum heat sinks.

5. The method of claim 1 in which:

the providing of the wiring surfaces includes providing metalized ceramic wiring surfaces;

the method further comprises selecting an aluminum alloy for the heat sinks and the method further comprises roughening the connection surface of the aluminum heat sinks.

6. The method of claim 1 in which:

the method further comprises selecting an aluminum alloy for the heat sinks; and the method further comprises coating the connection surface of the aluminum heat sinks with chromate conversion.

7. The method according to claim 1, wherein the electrically connecting comprises reflowing solder to form solder joints between metal pads on the semiconductor chip and metal pads on the wiring surfaces.

8. The method according to claim 1, further comprising:

connecting additional semiconductor chips to the wiring surfaces; and wherein depositing the silicone adhesive comprises depositing the adhesive between the heat sink and multiple semiconductor chips.

9. The method according to claim 1, wherein providing wiring surfaces comprises producing a metalized ceramic substrate.

10. The method according to claim 1, wherein depositing of the adhesive and pressing together the heat sinks and semiconductor chips produce a layer of adhesive 2–4 mils thick.

11. The method according to claim 1, wherein the organic material of the encapsulant is an epoxy.

12. The method according to claim 1, further comprising:

depositing a conformal coating of epoxy on the wiring surfaces around the semiconductor chips up to approximately the level of the semiconductor chips.

13. The method according to claim 1, wherein depositing the silicone adhesive comprises depositing the silicone adhesive around the semiconductor chips between the heat sinks and the conformal coating.

14. The method according to claim 1, further comprising:

filling the silicone adhesive with particles of alumina ceramic.

15. The method according to claim 1, further comprising:

filling the silicone adhesive with particles of aluminum metal.

16. The method according to claim 1, further comprising:

selecting a one part silicone adhesive.

17. The method according to claim 1, further comprising:

selecting a copper alloy for the heat sinks.

18. The method according to claim 1, further comprising:

plating a connection surface of the heat sinks with nickel.

19. The method according to claim 18, further comprising:

treating the nickel plated connection surface with hydrogen peroxide.

20. The method according to claim 19, wherein the treating with hydrogen peroxide includes heating the hydrogen peroxide to 60° C. to 90° C.

21. The method according to claim 19, wherein the treating with hydrogen peroxide includes heating the hydrogen peroxide to approximately 75° C.

22. The method according to claim 19, further comprising:

treating the nickel plated connection surface with aminoepoxide coupler during or after the treatment with hydrogen peroxide.

23. The method according to claim 19, further comprising:

treating the nickel plated connection surface with isopropyl alcohol prior to treating with hydrogen peroxide.

24. The method according to claim 19, further comprising:

rinsing the nickel plated connection surface with deionized water after treatment with hydrogen peroxide.

25. The method according to claim 1, wherein the electrical connecting includes depositing an electrically conductive thermoplastic adhesive on at least one of the semiconductor chips and the wiring surfaces.

26. The method according to claim 25, wherein the encapsulating comprises depositing a dielectric thermoplastic adhesive around the deposits of conductive thermoplastic adhesive on at least one of the semiconductor chips and the wiring surfaces.

27. The method according to claim 1, wherein providing the wiring surfaces includes providing a rigid organic substrate.

28. The method according to claim 27, wherein providing the rigid substrate includes providing axially stiff fibers and filling epoxy with the fibers.

29. The method according to claim 28, wherein providing the axially stiff fibers includes providing woven fiberglass fabric.

30. The method according to claim 1, wherein depositing the silicone adhesive includes filling the space around the semiconductor chip between the heat sink and the wiring surface with the silicone adhesive.

31. The method according to claim 1, further comprising:
selecting a copper alloy for the heat sinks.

32. The method according to claim 31, further comprising:
coating a connection surface of the copper heat sinks with chromium.

33. The method according to claim 1, wherein providing wiring surfaces includes providing one or more wiring layers of metal film separated and covered by two or more films of organic dielectric film to form a flexible circuit board with windows in the dielectric layer covering the wiring surface to expose metal pads connected to conductors of the wiring layers.

34. The method according to claim 1, further comprising:
filling an area around the semiconductor chips between the wiring surfaces and the heat sinks with epoxy adhesive.

35. The method according to claim 34, further comprising:
selecting a flexible-epoxy adhesive for the epoxy adhesive.

36. The method according to claim 1, further comprising:
selecting an aluminum alloy for the heat sink.

37. The method according to claim 36, further comprising:
anodizing a connection surface of the aluminum heat sink.

38. The method according to claim 1, wherein providing wiring surfaces includes providing a metalized ceramic wiring surface.

39. The method according to claim 36, further comprising:
roughening the connection surface of the aluminum heat sink.

40. The method according to claim 36, further comprising:
coating the connection surface of the aluminum heat sink with chromate conversion.

41. A method for producing chip carrier modules, comprising:
providing wiring substrates with wiring surfaces and attachment surfaces and windows through the substrates;
depositing first organic adhesive between the attachment surfaces and metal heat sinks;
pressing the heat sinks and respective attachment surfaces together;
heating to cure the first adhesive;
depositing silicone adhesive which is not fully cured between back surfaces of semiconductor chips and the heat sinks at respective windows;
pressing the heat spreaders and respective semiconductor chips together;
heating to cure the silicone adhesive, thereby directly attaching the heat sinks to the semiconductor chips;
connecting bond wires between wire bond pads on front surfaces of the semiconductor chips bonded to the heat sinks at the windows and wire bond pads on the wiring surfaces around the windows; and
encapsulating the bonding wires and the front surfaces of the chips with an organic material.

42. The method of claim 41 in which:
providing wiring substrates includes laminating together one or more films of metal covered by films of organic dielectric;
the first organic adhesive includes silicone adhesive;
the first organic adhesive includes flexible epoxy adhesive; and
the organic material is an epoxy.

43. The method according to claim 41, wherein providing the wiring substrates includes laminating together one or more films of metal covered by films of organic dielectric.

44. The method according to claim 41, wherein the first organic adhesive includes silicon adhesive.

45. The method according to claim 41, wherein the first organic adhesive includes flexible epoxy adhesive.

46. The method according to claim 41, wherein the encapsulating organic material comprises an epoxy.

* * * * *